US010756251B2

(12) United States Patent
Kim et al.

(10) Patent No.: US 10,756,251 B2
(45) Date of Patent: Aug. 25, 2020

(54) PIEZOELECTRIC FIBER HAVING EXCELLENT FLEXIBILITY AND ELASTICITY, AND METHOD FOR MANUFACTURING THE SAME

(71) Applicant: Industry-University Cooperation Foundation Hanyang University, Seoul (KR)

(72) Inventors: Seonjeong Kim, Seoul (KR); Hyeonjun Sim, Jeollanam-do (KR)

(73) Assignee: Industry-University Cooperation Foundation Hanyang University, Seoul (KR)

(*) Notice: Subject to any disclaimer, the term of this patent is extended or adjusted under 35 U.S.C. 154(b) by 605 days.

(21) Appl. No.: 15/532,338

(22) PCT Filed: Nov. 27, 2015

(86) PCT No.: PCT/KR2015/012850
§ 371 (c)(1),
(2) Date: Jun. 1, 2017

(87) PCT Pub. No.: WO2016/089048
PCT Pub. Date: Jun. 9, 2016

(65) Prior Publication Data
US 2017/0331027 A1    Nov. 16, 2017

(30) Foreign Application Priority Data
Dec. 2, 2014  (KR) .................. 10-2014-0170493

(51) Int. Cl.
*H01L 41/047* (2006.01)
*H01L 41/08* (2006.01)
(Continued)

(52) U.S. Cl.
CPC .......... *H01L 41/082* (2013.01); *H01L 41/087* (2013.01); *H01L 41/193* (2013.01);
(Continued)

(58) Field of Classification Search
CPC ... H01L 41/082; H01L 41/087; H01L 41/193; H01L 41/25; H01L 41/257; H01L 41/33; H01L 41/35
(Continued)

(56) References Cited

U.S. PATENT DOCUMENTS 4,278,000 A * 7/1981 Saito ...................... G10H 3/185
                                                              310/328
4,486,683 A * 12/1984 Newman ................. H01L 41/45
                                                              264/435
(Continued)

FOREIGN PATENT DOCUMENTS

GB    2042256 A * 9/1980 ............. H01L 41/04
JP    2006-25593 A    1/2006
(Continued)

OTHER PUBLICATIONS

International Search Report for PCT/KR2015/012850 dated Mar. 29, 2016 [PCT/ISA/210].

*Primary Examiner* — Thomas M Dougherty
(74) *Attorney, Agent, or Firm* — Sughrue Mion, PLLC

(57) ABSTRACT

The present invention relates to a piezoelectric fiber having excellent flexibility, the piezoelectric fiber employs a conductive fiber member as an inner electrode, on which a piezoelectric polymer layer, an outer electrode and a coating layer are sequentially formed, thereby having excellent flexibility and sufficient elasticity to be sewed, woven, knotted or braided. Therefore, the piezoelectric fiber can be applied in power supplies for a variety of sizes and types of wearable electronic devices, portable devices, clothing, etc.

(Continued)

In addition, since the piezoelectric fiber has excellent piezoelectricity and durability because of the above-described structure, it can effectively convert deformation or vibration caused by external physical force into electric energy, and thus can replace existing ceramic-based and polymer piezoelectric bodies, etc. Furthermore, an economical and simple method of manufacturing a piezoelectric fiber having excellent piezoelectricity is provided.

18 Claims, 13 Drawing Sheets

(51) Int. Cl.
    *H01L 41/087*     (2006.01)
    *H01L 41/193*     (2006.01)
    *H01L 41/25*     (2013.01)
    *H01L 41/257*     (2013.01)
    *H01L 41/33*     (2013.01)
    *H01L 41/35*     (2013.01)

(52) U.S. Cl.
    CPC ............ *H01L 41/25* (2013.01); *H01L 41/257* (2013.01); *H01L 41/33* (2013.01); *H01L 41/35* (2013.01)

(58) Field of Classification Search
    USPC .......................................... 310/311–371, 800
    See application file for complete search history.

(56) References Cited

U.S. PATENT DOCUMENTS

| | | | | |
|---|---|---|---|---|
| 5,410,210 | A * | 4/1995 | Sato | H01L 41/047 310/332 |
| 8,803,406 | B2 * | 8/2014 | Lee | H01L 41/183 310/339 |
| 2005/0274176 | A1 * | 12/2005 | Thiesen | B60C 23/0411 73/146 |
| 2008/0118759 | A1 | 5/2008 | Korpi | |
| 2009/0021117 | A1 * | 1/2009 | Ueda | G01H 11/08 310/329 |
| 2009/0302714 | A1 * | 12/2009 | Kim | H01L 41/087 310/358 |
| 2009/0309456 | A1 * | 12/2009 | Stollberg | H01L 41/1136 310/319 |
| 2010/0230629 | A1 * | 9/2010 | Yu | H01L 41/193 252/62.9 R |
| 2011/0192016 | A1 * | 8/2011 | Kang | B82Y 30/00 29/592.1 |

FOREIGN PATENT DOCUMENTS

| | | |
|---|---|---|
| KR | 10-2012-0122402 A | 11/2012 |
| KR | 10-2013-0073730 A | 7/2013 |
| KR | 10-2014-0009750 A | 1/2014 |

* cited by examiner

[FIG. 1]
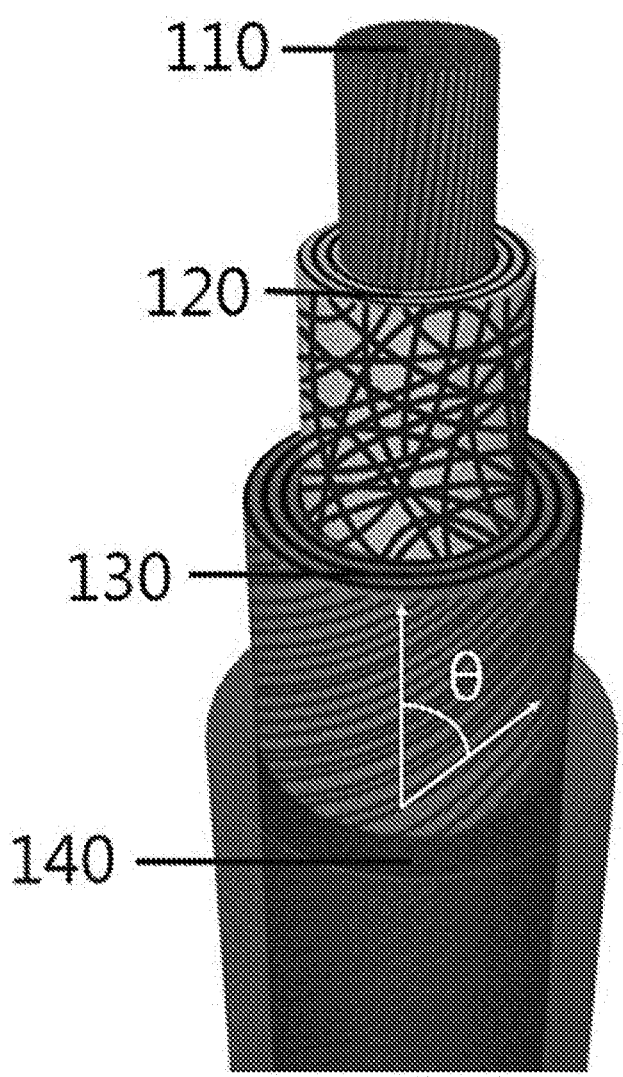

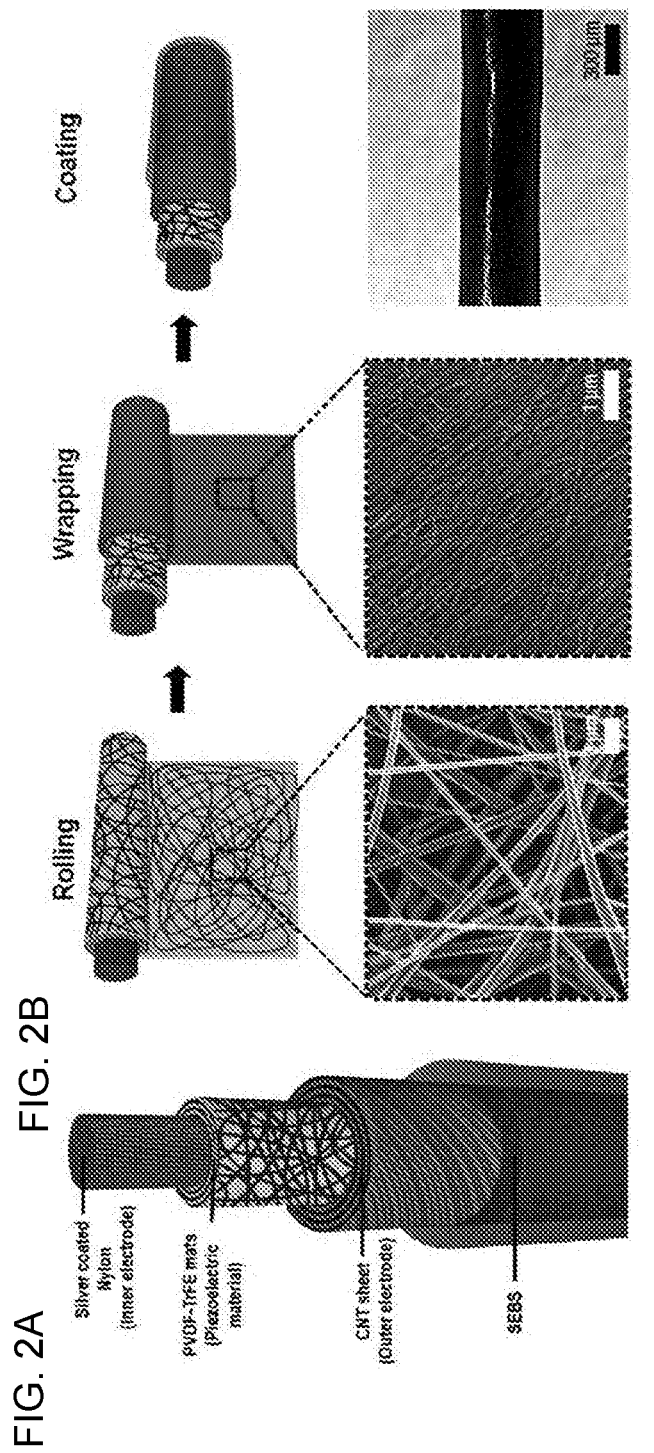

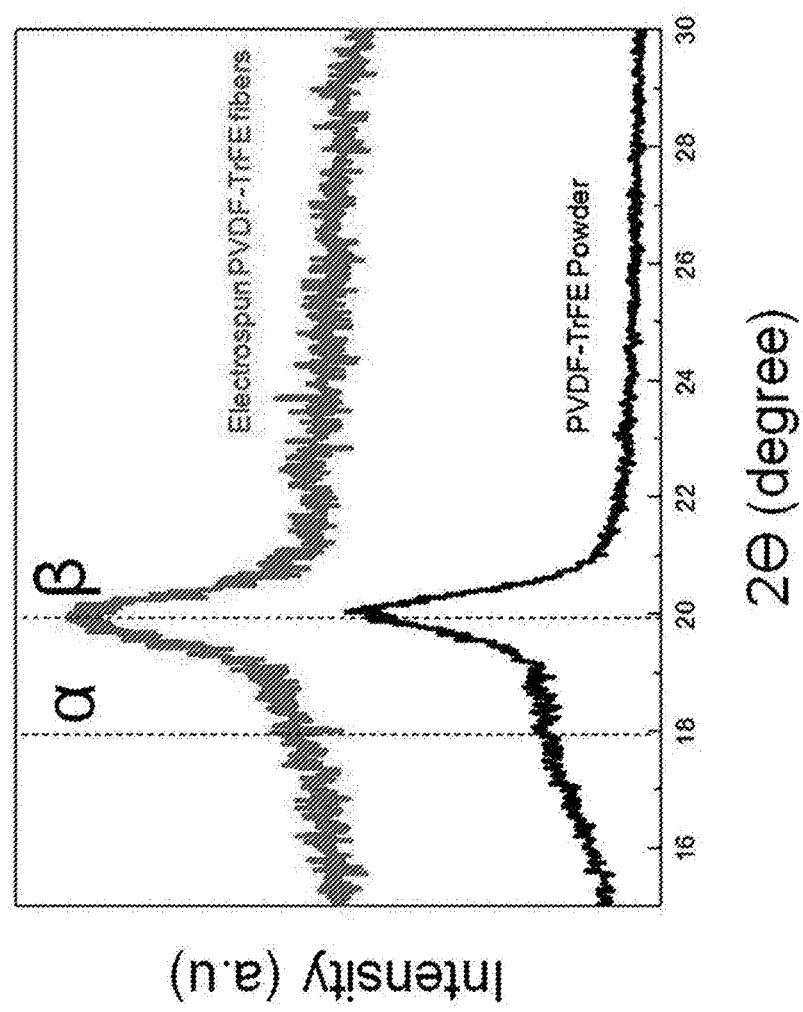
[FIG. 3]

【FIG. 5】
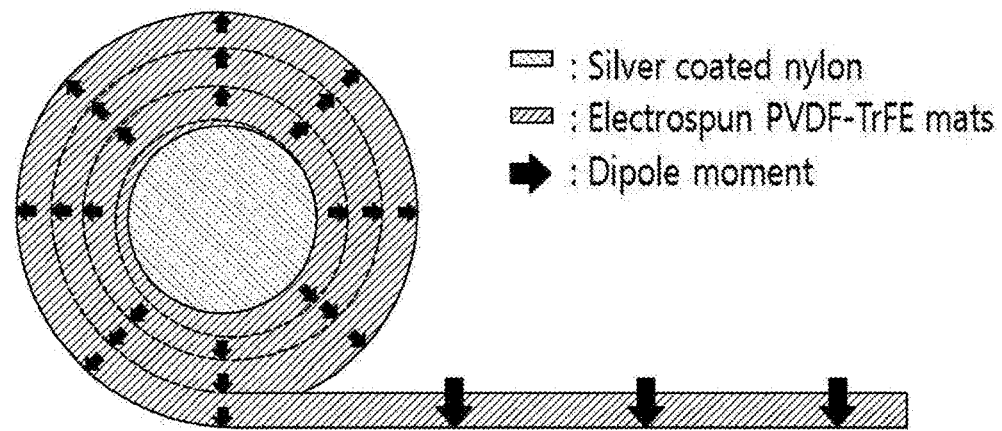
【FIG. 6】
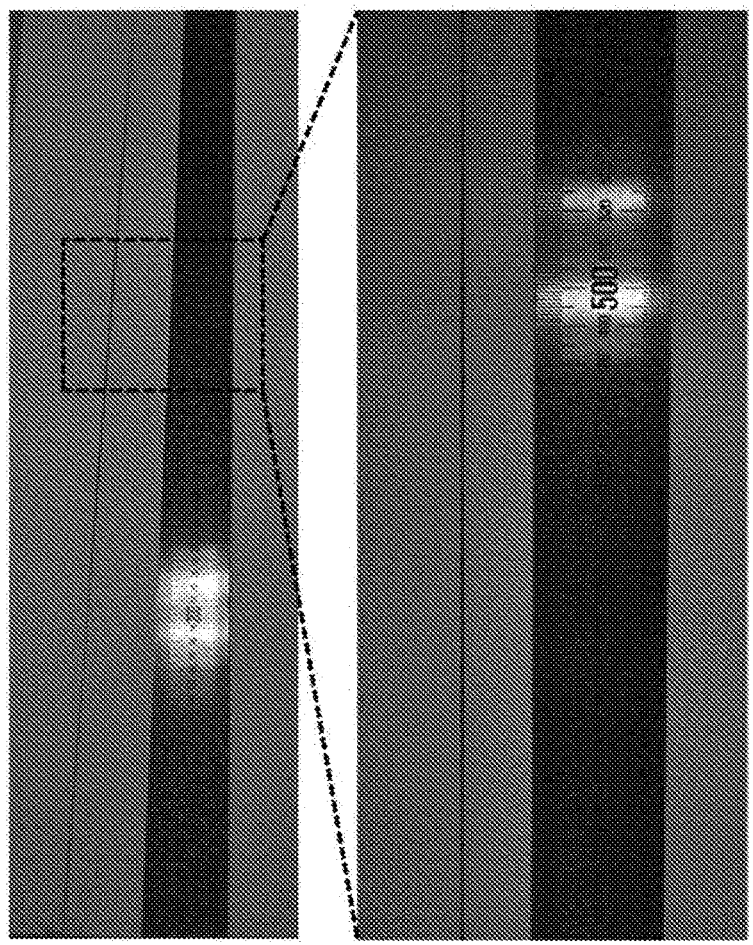

[FIG. 7]
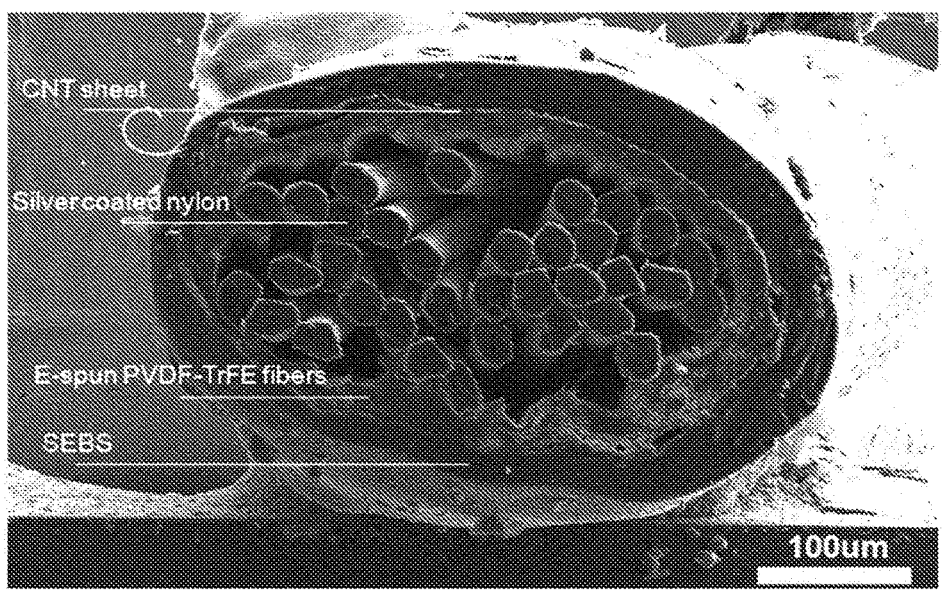

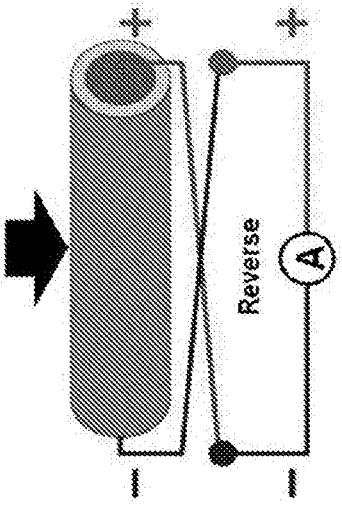
FIG. 9A
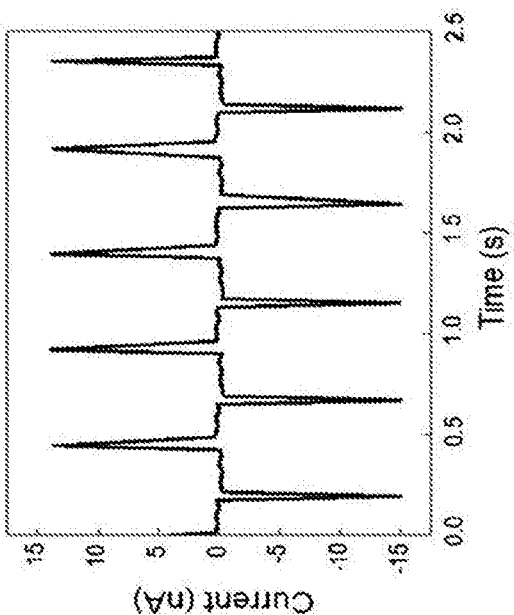
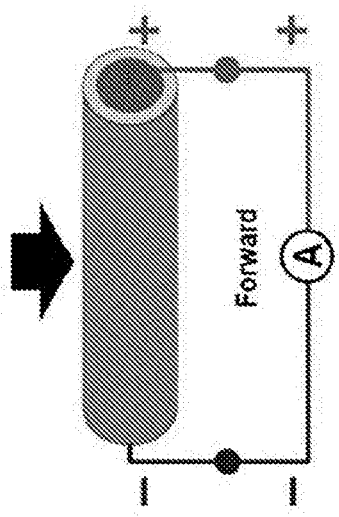
FIG. 9B
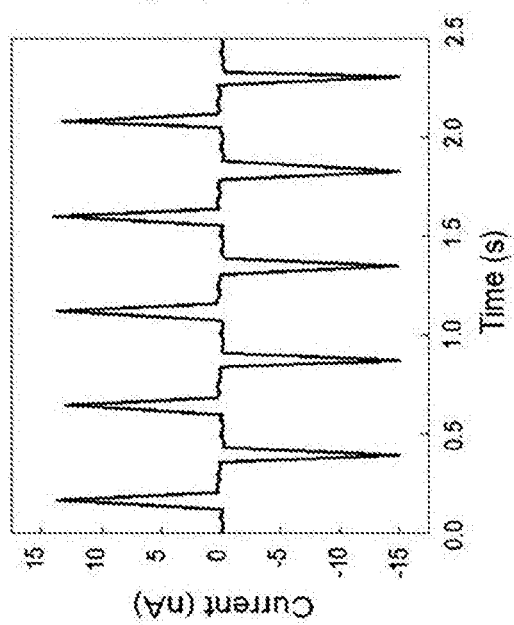

[FIG. 11]
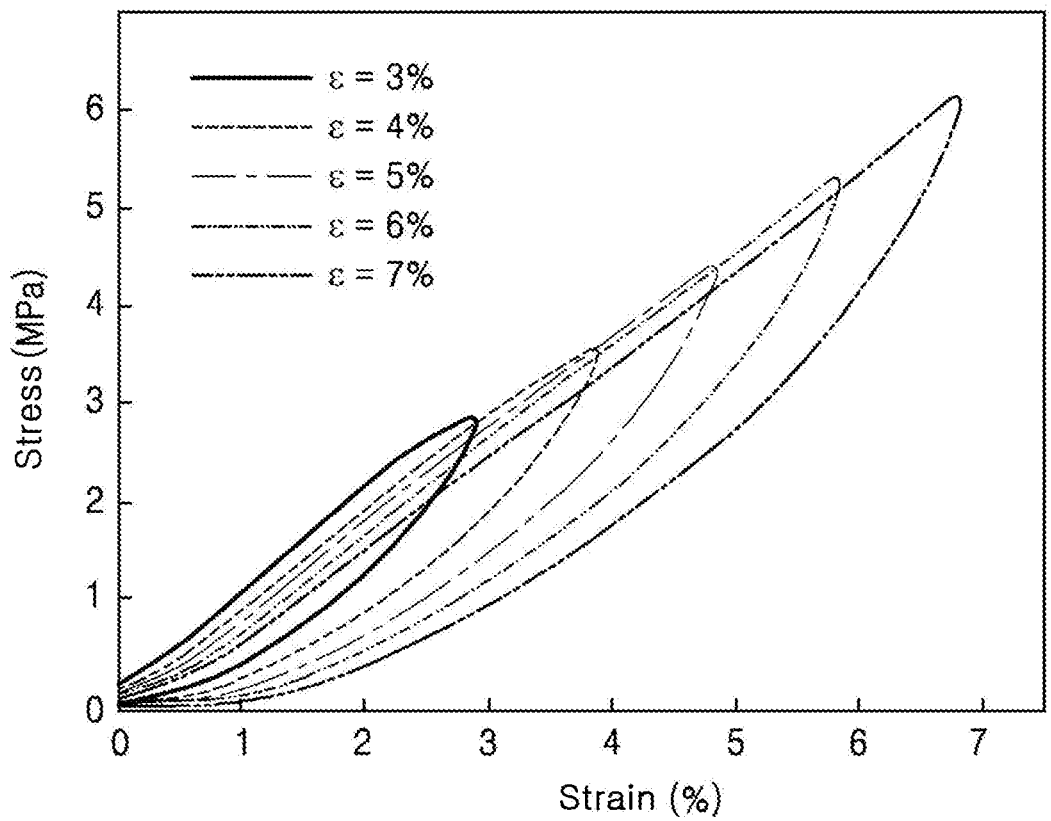

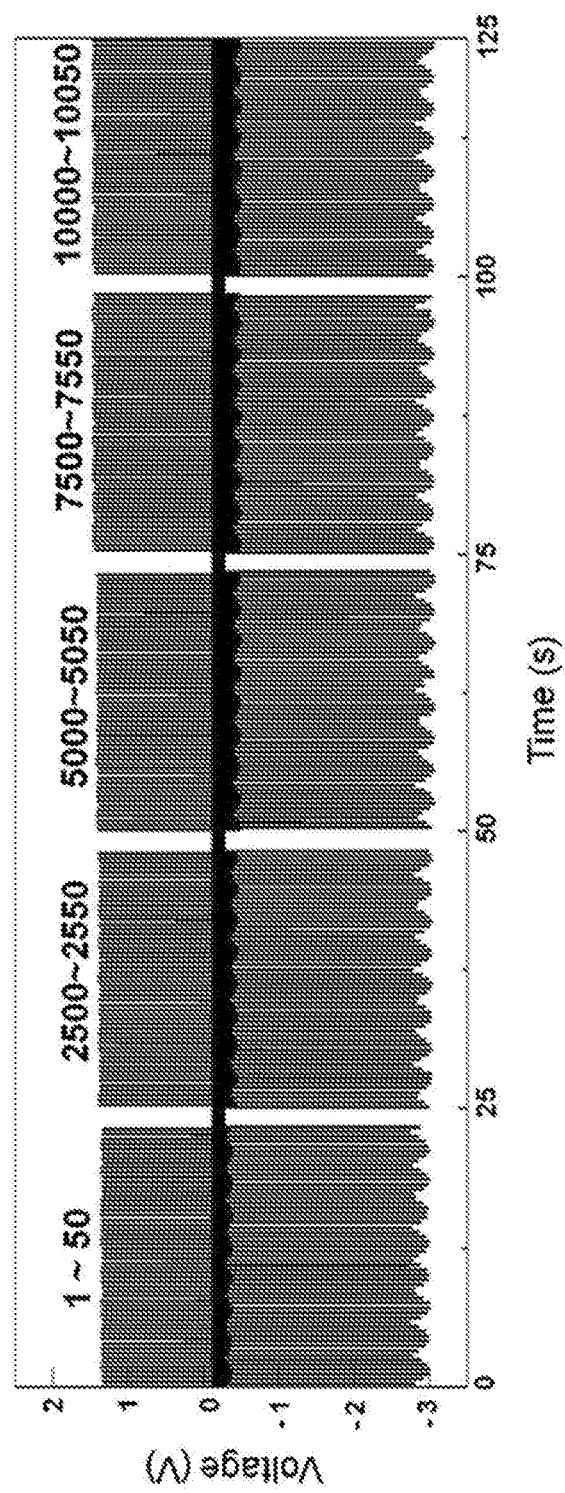
[FIG. 12]

PIEZOELECTRIC FIBER HAVING EXCELLENT FLEXIBILITY AND ELASTICITY, AND METHOD FOR MANUFACTURING THE SAME

CROSS REFERENCE TO RELATED APPLICATIONS

This application is a National Stage of International Application No. PCT/KR2015/012850, filed on Nov. 27, 2015, which claims priority from Korean Patent Application No. 10-2014-0170493, filed on Dec. 2, 2014, the contents of all of which are incorporated herein by reference in their entirety.

TECHNICAL FIELD

The present invention relates to a piezoelectric fiber and a manufacturing method thereof, and more particularly, to a piezoelectric fiber having excellent flexibility and elasticity, and a method of manufacturing the same.

BACKGROUND ART

In recent years, with the development of human clothing and various wearable portable electronic devices such as wearable computers, smart wear, etc., there has been a sharp rise in the demand for portable power supplies that can be driven for a long time and are slim and light enough to minimize the burden of carrying them.

Conventionally, as portable power supplies, chemical cells or rechargeable batteries have been used, and they can cause serious environmental pollution when they are disposed of.

To avoid this problem, devices that can use natural energy produced from wind power, geothermy, solar heat, or wave power, etc. as electric energy and can provide environmentally friendly power have been developed, but they are too big to carry. Further, since these devices are highly influenced by the environment, they have low efficiency per unit area.

Therefore, research has been conducted to develop energy harvesting techniques that can convert human kinetic energy that can be continuously generated into a new electrical power source. That is, such research is based on the idea that power supplied by utilizing energy generated from motion of the human body can be a continuous energy source that is not restricted by time and space, and thus can overcome the problems of conventional electrical power supplies.

Among the energy harvesting techniques, those utilizing piezoelectric materials have been widely studied because these materials can be operated on the basis of motions of the human body, such as a heart rate, respiration, muscle contractions, and eye movements.

For example, a flexible piezoelectric energy harvester that is in a substrate form and includes a piezoelectric material such as polyvinylidene fluoride (hereinafter also referred to as "PVDF") has been disclosed. The piezoelectric energy harvester includes a grid-patterned piezoelectric layer, which is composed of first piezoelectric lines or islets and second piezoelectric lines consisting of a piezoelectric polymer and filling gaps between the first piezoelectric lines, and therefore is flexible and hard to break (Patent Document 1).

Meanwhile, a sandwich-formed piezoelectric fabric in which a piezoelectric layer manufactured by electrospinning is disposed between electrode layers formed by electrospinning conductive polymers has been disclosed (Patent Document 2).

Both of the conventional arts pertain to flexible two-dimensional piezoelectric energy harvesters. However, these piezoelectric energy harvesters exhibit low flexibility and elasticity and thus are difficult to fabricate into clothing or fabrics having complicated structures, and their efficiency at converting motion of the human body into electric energy is significantly low.

In order to solve both the above-mentioned problems and to manufacture a wearable energy harvester, a technique of modifying a conventional two- or three-dimensional piezoelectric energy harvester into a one-dimensional fibrous form has been suggested. Due to the high degree of mechanical freedom, such a fiber-type energy harvester could also be sufficiently used as a material for pleated fabrics.

As examples, a hybrid fiber-type energy harvester including zinc oxide (ZnO) and PVDF (Non-patent Document 1), and an energy harvester including a common axis of polyvinylidene fluoride-co-trifluoroethylene (PVDF-TrFE) and two or more fibers and a textile fabricated therewith (Non-patent Document 2) have been disclosed. However, because these two energy harvesters also employ piezoelectric ceramics, which generally serve as metallic electrodes, they still have low flexibility and elasticity, and thus are limited to the structure of cloth.

(Patent Document 1) KR patent publication 10-2014-0073201
(Patent Document 2) KR patent publication 10-2012-0083261
(Non-patent Document 1) M. B. Lee, C. Y. Chen, S. W. Cha, Y. J. Park, J. M. Kim, L. J. Chou, Z. L. Wang, Adv. Mater. 2012, 24, 1759
(Non-patent Document 2) M. B. Kechiche, F. Bauer, O. Harzallah, J. Y. Drean, Sensors and Actuators A. 2013, 204, 122

DISCLOSURE

Technical Problem

The present invention has been made in view of the above-described problems, and therefore is directed to providing a piezoelectric fiber that has excellent flexibility and elasticity, exhibits high mechanical toughness against external pressures, and can convert external pressures or mechanical vibrations into electric energy.

Further, the piezoelectric fiber of the present disclosure can be used in weaving, knotting and sewing, and thus can be applied in various wearable electronics and clothing.

The present invention is also directed to providing a manufacturing method capable of mass production of the piezoelectric fiber.

Technical Solution

An aspect of the present invention provides a piezoelectric fiber, which includes: an inner electrode composed of at least one conductive fiber member; a piezoelectric polymer layer formed in at least one layer to be rolled around the inner electrode; an outer electrode formed to wrap the surface of the piezoelectric polymer layer; and an insulating layer formed on the surface of the outer electrode.

The conductive fiber member may include at least one selected from the group consisting of a conductive metal-coated polymer fiber, a carbon fiber and a conductive metal-coated carbon fiber. The conductive metal may include at least one selected from the group consisting of Fe, Ni, Cr, Ti, Mo, Ag, Au, Al, and Cu. The piezoelectric polymer layer may include at least one piezoelectric polymer selected from the group consisting of PVDF, PVDF-TrFE, PVDF-TrFE-CFE and PVDF-HFP. The piezoelectric polymer layer may be formed by electrospinning. The outer electrode may be a CNT sheet. The CNT sheet may have a twist angle ($\theta$) of 30 to 60 degrees. The insulating layer may include at least one polymer selected from the group consisting of polyurethane (PU), polyvinylalcohol (PVA), silicon rubber, a polystyrene butadiene copolymer (SBS), a polystyrene isoprene copolymer (SIS), a polystyrene ethylene butadiene block copolymer (SEBS), and a polystyrene ethylene propylene block copolymer (SEPS). The piezoelectric fiber may have a diameter of 200 to 500 µm. The piezoelectric fiber may have an elastic strain of 1 to 10%. In addition, the present invention provides a coil-shaped piezoelectric fiber manufactured by twisting the piezoelectric fibers. The coil-shaped piezoelectric fiber is prepared by twisting the piezoelectric fiber at a density of 1,000 to 10,000 twists/m. The coil-shaped piezoelectric fiber may have an elastic strain of 10 to 100%.

Another aspect of the present invention provides a method of manufacturing a piezoelectric fiber, which includes: I) preparing an inner electrode including a conductive fiber member; II) forming a piezoelectric polymer layer by rolling a mat-type piezoelectric polymer manufactured by electrospinning around the surface of the inner electrode; III) forming an outer electrode on the surface of the piezoelectric polymer layer; and IV) forming an insulating layer on the outer electrode. In step II), the piezoelectric polymer layer may be formed in a single layer or multilayer structure according to the number of times the mat-formed piezoelectric polymer manufactured by electrospinning is rolled around the surface of the inner electrode. In step II), the mat-type piezoelectric polymer may be any one piezoelectric polymer selected from the group consisting of PVDF, PVDF-TrFE, PVDF-TrFE-CFE and PVDF-HFP. In step III), the outer electrode may be a CNT sheet, and the CNT sheet may be formed by drawing a carbon nanotube layer (CNT forest) vertically grown by chemical vapor deposition (CVD). In step IV), the forming of the insulating layer on the outer electrode may be carried out by forming an insulating layer by coating the surface of the outer electrode with a solution containing at least one polymer selected from the group consisting of polyurethane (PU), polyvinylalcohol (PVA), silicon rubber, a polystyrene butadiene copolymer (SBS), a polystyrene isoprene copolymer (SIS), a polystyrene ethylene butadiene block copolymer (SEBS) and a polystyrene ethylene propylene block copolymer (SEPS). The solution may include the polymer at 1 to 20 wt %, and remaining chloroform.

Advantageous Effects

According to the present invention, a piezoelectric fiber employs a conductive fiber member as an inner electrode, on which a piezoelectric polymer layer, an outer electrode and a coating layer are sequentially formed, thereby having excellent flexibility and sufficient elasticity to be sewed, woven, knotted or braided. Therefore, the piezoelectric fiber can be applied in power supplies for a variety of sizes and types of wearable electronic devices, portable devices, clothing, etc.

In addition, since the piezoelectric fiber has excellent piezoelectricity and durability because of the above-described structure, it can effectively convert deformation or vibration caused by external physical force into electric energy, and thus can replace existing ceramic-based and polymer piezoelectric bodies, etc.

Furthermore, the present invention provides an economical and simple method of manufacturing a piezoelectric fiber having excellent piezoelectricity.

DESCRIPTION OF DRAWINGS

FIG. 1 is a perspective view illustrating a structure of a piezoelectric fiber according to an embodiment of the present invention.

FIGS. 2A-2E are a series of conceptual diagrams illustrating the structure and a process of manufacturing a piezoelectric fiber according to an embodiment of the present invention.

FIG. 3 shows X-ray diffraction spectra of PVDF-TrFE used to manufacture the PVDF-TrFE mat constituting the piezoelectric polymer layer of the piezoelectric fiber according to an embodiment of the present invention before (black) and after (red) electrospinning.

FIG. 5 is a conceptual diagram illustrating the procedure of Example 1-2) in which the PVDF-TrFE mat manufactured by electrospinning according to an embodiment of the present invention was rolled around the silver-coated nylon fiber serving as an inner electrode of an embodiment of the present invention, wherein red arrows represent dipole moments in the PVDF-TrFE mat.

FIG. 6 is an optical image of the piezoelectric fiber manufactured in Example 1 of the present invention.

FIG. 7 is an SEM image of the cross section of the piezoelectric fiber manufactured in Example 1 according to the present invention.

FIG. 8 depicts output signals generated against movements of the piezoelectric fiber manufactured in Example 1 according to the present invention, in further detail.

FIG. 9A is a graph of short circuit output currents generated when the piezoelectric fiber manufactured in Example 1 according to the present invention was connected in a forward direction, and FIG. 9B is a graph of short circuit output currents generated when the piezoelectric fiber manufactured in Example 1 according to the present invention was connected in a reverse direction. Here, a pressure of 160 kPa was repeatedly applied at an impact speed of 100 mm/s.

FIG. 11 shows a graph of the elastic strain (%) of the piezoelectric fiber manufactured in Example 1 against tensile stress.

FIG. 12 is a graph of open circuit output voltages created by the piezoelectric fiber manufactured in Example 1 during repetitive cycles of contractions (maximum 10,050 cycles), illustrating the stability of the piezoelectric fiber of the present invention.

FIG. 13 illustrates the piezoelectricity of the coil-shaped piezoelectric fiber manufactured in Example 2 against lengthwise elongation.

MODES OF THE INVENTION

Figure 4A:
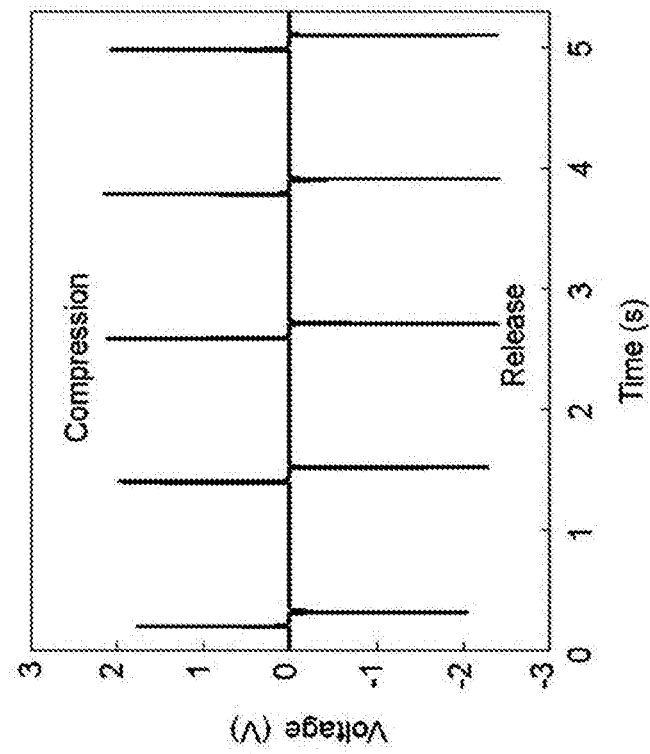
FIG. 4A is a conceptual diagram illustrating the structure of the PVDF-TrFE mat according to an embodiment of the present invention, manufactured by electrospinning, for use in a pressure test.

Hereinafter, the present invention will be described in further detail with reference to several aspects and various exemplary embodiments.

One aspect of the present invention relates to a piezoelectric fiber including: an inner electrode 110 including a conductive fiber member; a piezoelectric polymer layer 120 formed in at least one layer to be wrapped around the inner electrode; an outer electrode 130 formed to be wrapped around the surface of the piezoelectric polymer layer; and an insulating layer 140 formed on the surface of the outer electrode 130. In FIG. 1, the structure of the piezoelectric fiber according to an embodiment of the present invention is depicted in detail.

When the piezoelectric fiber according to the present invention is subjected to mechanical deformation, such as extension and contraction, due to external physical force, the polarization of a charge may be induced in the piezoelectric polymer layer 120 included in the piezoelectric fiber. That is, when the piezoelectric fiber is repeatedly extended and contracted, the piezoelectric polymer layer 120 contained in the piezoelectric fiber also undergoes repeated extension and contraction. When the piezoelectric polymer layer 120 is subjected to the repeated extension and contraction, the charge polarization generated in the piezoelectric material undergoes repeated changes in polarity to generate electric signals (electric energy). The piezoelectric fiber of the present invention is superior to the fiber-type piezoelectric device (400 mV) reported previously (Non-patent Document 2) in terms of an output voltage relative to a diameter.

Any fiber member that exhibits electroconductivity may be used as the conductive fiber member included in the inner electrode 110 without limitation. The conductive fiber member may be a carbon fiber, a conductive metal-coated carbon fiber, or a conductive metal-coated polymer fiber. Here, the conductive metal may be at least one selected from the group consisting of Fe, Ni, Cr, Ti, Mo, Ag, Au, Al, and Cu.

The conductive fiber member may be a monofilament or a multifilament containing one or more monofilaments. As an example, the conductive fiber member may be any one selected from the group consisting of a conductive polyester fiber, a carbon fiber, a silver-coated polymer fiber, a copper-coated polymer fiber, a chromium-coated polymer fiber, an iron-coated polymer fiber, a titanium-coated polymer fiber, and a nickel-coated carbon fiber.

Further, the conductive metal may be a nanowire or nanoparticles.

In addition, due to flexibility and elasticity, the inner electrode 110 changes in volume and shape without structural damage or breakage when external physical force is applied, but easily goes back to its original state when the physical force disappears. Accordingly, the inner electrode can freely convert external pressure or mechanical vibration in all directions into electric energy, and may be structured to have a large surface area for receiving external pressure.

The conductive fiber member forming the inner electrode 110 has a diameter of 1 to 100 μm. A conductive fiber member having a diameter of less than 1 μm will be difficult to manufacture. On the other hand, if the conductive fiber member had a diameter of more than 100 μm, due to the increased thickness of the piezoelectric fiber, there would be a structural limit on devices or fabrics manufactured using the piezoelectric fiber.

The piezoelectric polymer layer 120 may be formed of one piezoelectric polymer selected from the group consisting of PVDF, PVDF-TrFE, PVDF-TrFE-CFE and PVDF-HFP, and most preferably PVDF-TrFE.

Generally, the piezoelectric characteristic highly depends on a degree of dipole array. Materials with a random dipole array, such as bulk ceramics, single crystals, and polymers, do not exhibit the piezoelectric characteristic. Therefore, in order for these materials to have piezoelectricity, it is necessary to perform an additional poling process of aligning dipoles in one direction.

However, since the piezoelectric polymer layer 120 of the present invention is manufactured by electrospinning, the electric dipole array is simultaneously generated during the electrospinning process, in which a high voltage is applied between a substrate and an integrated electrode on a nozzle. For this reason, no additional poling process is needed.

The dipole array structure of the piezoelectric polymer layer 120 according to the present invention is depicted in FIG. 5.

In addition, the piezoelectric polymer layer 120 has a network structure in which the nanofibers are randomly dispersed in the form of a mat manufactured by electrospinning, which is shown in detail in FIG. 2C. When the piezoelectric polymer layer 120 in this structure is extended lengthwise by external force (tension), the nanofilaments randomly dispersed in the mat are aligned in the lengthwise direction, like a sponge. Thus, the nanofibers can flexibly cope with various kinds of strain such as bending, twisting, folding, etc., so that the fiber can undergo changes in various shapes without damaging the nanofibers of the piezoelectric polymer layer 120.

In some particular embodiments, the piezoelectric polymer layer 120 may preferably have a thickness of 30 µm or more. For example, if the thickness of the piezoelectric polymer layer 120 were less than 30 µm, a short circuit may occur. In addition, each of the nanofibers, which are constitutional members of the piezoelectric polymer layer 120, may have a diameter of 500 to 1000 nm.

Further, the piezoelectric polymer layer 120 may be of a single layer or multilayer structure.

When the fiber is subjected to strain, such as pushing, bending, twisting, etc., the outer electrode 130 is exposed to greater stress than the inner electrode 110 and thus the electrical connection thereof is more apt to be damaged.

To avoid this problem, in the present invention, the outer electrode 130 may preferably be made of a CNT sheet, which exhibits excellent conductivity, durability and adhesiveness.

As shown in FIGS. 2A and 2D, the CNT sheet serving as the outer electrode 130 may be formed by drawing a carbon nanotube layer (CNT forest) vertically grown by chemical vapor deposition.

The CNT sheet may be formed to be wrapped around the surface of the piezoelectric polymer layer 120. In detail, a CNT sheet is spirally wrapped around the piezoelectric polymer layer 120 at a twist angle (θ) of 30 to 60 degrees in a clockwise or counterclockwise direction.

As used herein, the term "twist angle (θ)" refers to an aligned state of carbon nanotubes in the CNT sheet, specifying the angle of the carbon nanotubes with respect to the longitudinal axis of the piezoelectric fiber on the basis of the center of the piezoelectric fiber. This is shown in further detail with reference to FIG. 1.

Since the CNT sheet is strongly adhered to the piezoelectric polymer layer 120 via Van der Waals force and has excellent deformability, the structure and properties of the CNT sheet may be stably maintained even when the piezoelectric fiber is strained by pushing, bending or twisting.

When an external physical force is applied to the piezoelectric fiber according to the present invention, the distances between the individual carbon nanotubes increase and the twist angle with regard to the piezoelectric polymer layer 120 decreases, and therefore the strain exerted on the CNT sheet constituting the outer electrode 130 is mitigated. This structural constitution allows the carbon nanotubes to maintain their mechanical and electrical properties without breakage or damage even when the piezoelectric fiber undergoes various changes in size and shape.

However, when the twist angle (θ) of the CNT sheet is less than 30° or more than 60°, the deformability significantly may decrease and thus it may be easily broken even by a small strain.

A conventional piezoelectric fiber including a gold-sputtered electrode as an outer electrode 130 suffers from the disadvantage of having a burden limit of as low as or less than 0.3% (Non-patent Document 1). As described above, however, the CNT sheet is used to be wrapped around the surface of the piezoelectric polymer layer 120 at the twist angle (θ) set according to the present invention, overcoming the problem encountered by the conventional piezoelectric fiber.

The insulating layer 140, which is an electrical insulator, has excellent flexibility and contributes to improving the durability of the outer electrode 130. Any elastic polymer may be used for the insulating layer 140 without limitation.

Preferably, the insulating layer 140 may comprise at least one polymer selected from the group consisting of a polyurethane (PU), a polyvinylalcohol (PVA), a silicone rubber, a polystyrene butadiene block copolymer (SBS), a polystyrene isoprene copolymer (SIS), a polystyrene ethylene butadiene block copolymer (SEBS), and a polystyrene ethylene propylene block copolymer (SEPS). More preferably, a polystyrene isoprene copolymer (SIS) and a polystyrene ethylene butadiene block copolymer (SEBS) may be used, both of which have the highest elasticity.

The piezoelectric fiber may range in diameter from 200 to 500 µm. When the diameter of the piezoelectric fiber exceeds 500 µm, morphological limitations may be imposed on its integration in textile structure or application to a device due to an increase in its thickness.

Due to the system described above, the piezoelectric fiber of the present invention not only exhibits superiority in functions such as elastic strain relative to diameter and output voltage, but is also remarkably improved in flexibility and elasticity. Thus, the piezoelectric fiber of the present invention can be applied in many fields where conventional piezoelectric fibers cannot be used, including power supplies for wearable electronic devices and portable devices in various sizes and shapes, clothing, etc.

In addition, the piezoelectric fiber of the present invention may have an elastic strain of 1 to 10%.

Another aspect of the present invention provides a coil-shaped piezoelectric fiber, prepared by twisting the piezoelectric fiber described above. More particularly, a coil-shaped piezoelectric fiber, manufactured by twisting piezoelectric fibers at a density of 1,000 to 10,000 twists/m, includes: an inner electrode composed of at least one conductive fiber member; a piezoelectric polymer layer formed in at least one layer to be rolled around the inner electrode; an outer electrode formed to be wrapped around the surface of the piezoelectric polymer layer; and an insulating layer formed on the surface of the outer electrode. The term "twists/m" as used herein refers to the number of turns applied per unit length (meter) of the piezoelectric fiber of the present invention.

The number of turns (twist/m) applied to the piezoelectric fiber may be suitably selected within the above range depending on the diameter of the piezoelectric fiber.

It can be seen that the coil-shaped piezoelectric fiber greatly increases in elastic strain to 10 to 100%, which is extraordinarily improved compared to 0.18%, which is the elastic strain of a conventional piezoelectric fiber (R. L. Hadimani, D. V. Bayranmol, N. Sion, T. Shah, L. Qian, S. Shi, E. Siores, *Smart Mater. Struct.* 2013, 22, 0750017), and 30%, which is the elastic strain of elastic piezoelectric device using a micro-patterned electrode (J. H. Lee, K. Y. Lee, M. K. Gupta, T. Y. Kim, D. Y. Lee, J. Oh, C., W. J. Yoo, C. Y. Kang, S. J. Yoon, J. B. Yoo, S. W. Kim, *Adv. Mater.* 2014, 26, 765).

Since such a large elastic strain covers the maximum deformation that can be caused by motion from the human body, the piezoelectric fiber in the coiled structure is very suitable as a fabric material applicable to the human body.

The piezoelectric fiber and the piezoelectric fiber in a coil structure according to the present invention exhibit excellent piezoelectricity in addition to having high flexibility and elasticity as delineated above, and can create electrical signals in response to various stimuli. Hence, both can be used as sensors for measuring various activities of the human body, particularly including stretch and contraction, based on such properties.

Also, a method of manufacturing a piezoelectric fiber in accordance with a further aspect of the present invention includes the steps of:

I) preparing an inner electrode including a conductive fiber member;

II) rolling a piezoelectric polymer in a mat form manufactured by electrospinning around a surface of the inner electrode to form a piezoelectric polymer layer;

III) forming an outer electrode on the surface of the piezoelectric polymer layer; and IV) forming an insulating layer on the outer electrode.

FIG. 2 is a series of conceptual diagrams illustrating the structure and a process of manufacturing a piezoelectric fiber according to the present invention. A method of manufacturing the piezoelectric fiber according to the present invention is as follows.

With reference to FIG. 2, first, an inner electrode including a conductive fiber member is prepared.

Any fiber member that is electrically conductive can be used as the inner electrode 110 without limitation. A carbon fiber, a conductive metal-coated carbon fiber, and a conductive metal-coated polymer fiber may be preferable. Here, the conductive metal may be at least one selected from the group consisting of Fe, Ni, Cr, Ti, Mo, Ag, Au, Al, and Cu.

The conductive fiber member may be a monofilament or a multifilament containing one or more monofilaments.

By way of example, the conductive fiber member may be any one selected from the group consisting of a conductive polyester fiber, a carbon fiber, a silver-coated polymer fiber, a copper-coated polymer fiber, a chromium-coated polymer fiber, an iron-coated polymer fiber, a titanium-coated polymer fiber, and a nickel-coated carbon fiber.

Further, the conductive metal may be a nanowire or nanoparticles.

The conductive fiber member serving as a constitutional member of the inner electrode 110 has a diameter of 1 to 100 µm. When the conductive fiber member has a diameter of less than 1 µm, it is difficult to prepare. On the other hand, when the diameter of the conductive fiber member exceeds 100 µm, due to the increased thickness of the piezoelectric fiber of the present invention, there is a limit on a structure in manufacture of a device or textile using the piezoelectric fiber.

Thereafter, a piezoelectric polymer layer is formed by rolling a mat-type piezoelectric polymer manufactured by electrospinning around the surface of the inner electrode.

The piezoelectric polymer layer is formed by manufacturing a mat-type piezoelectric polymer by electrospinning a piezoelectric polymer spinning solution, and then rolling the mat-type piezoelectric polymer around the surface of the inner electrode.

The piezoelectric polymer layer may be formed of a piezoelectric polymer selected from the group consisting of PVDF, PVDF-TrFE, PVDF-TrFE-CFE, and PVDF-HFP, and most preferably PVDF-TrFE.

When the piezoelectric polymer layer is prepared using an electrospinning method, piezoelectricity, which highly depends on a dipole array, can be controlled. Materials with a random dipole array do not exhibit the piezoelectric characteristic. Therefore, in order for these materials to have piezoelectricity, it is necessary to perform an additional poling process of aligning dipoles in one direction.

However, when the piezoelectric polymer layer is manufactured using electro spinning, without the additional poling process, dipole arrays are simultaneously generated during the electrospinning process, in which a high electric field is applied between a substrate and an integrated electrode on a nozzle, and thus the piezoelectric polymer layer can be controlled to have excellent piezoelectricity.

In addition, when the dipole array-controlled, the piezoelectric polymer layer is simply rolled around the surface of the inner electrode, the dipole moments aligned in the top-to-bottom thickness direction are realigned in a radial direction, which allows the polymer layer to freely convert external pressure or mechanical vibrations applied in all directions into electric energy and to have a larger surface area for receiving external pressure.

In order to fabricate a piezoelectric fiber having excellent piezoelectric performance, a piezoelectric fiber must convert pressure and mechanical vibrations applied in all directions into electric energy even though it has a very small diameter. For this, the fiber is required to have "radially aligned dipole moments" on the surface thereof.

For such a constitution, a piezoelectric polymer layer in a "film" form with a dipole moment in the top-to-bottom thickness direction is rolled into a "fiber" form with the concomitant realignment of the dipole moment from the thickness direction to a radial direction, in accordance with the present invention.

This method of simply rolling the piezoelectric polymer layer has not been used prior to the present invention, and can be used to realign dipole moments with the greatest simplicity, stability, cost-efficiency and effectiveness. Further, the method can be used to make a piezoelectric fiber that can freely convert external pressures or mechanical vibrations applied in all directions into electric energy due to coiling of a piezoelectric polymer layer that is simply rolled.

The piezoelectric fiber according to the present invention has dipole moments that are realigned in a different direction from that of conventional piezoelectric polymer, that is, a radial direction, and thus exhibits higher piezoelectric performance.

Moreover, a poling process may be obviated through the above process, thus preventing the breakage and damage of the piezoelectric fiber which may be attributed to the poling process.

The piezoelectric polymer layer may be formed in a single layer or a multilayer structure according to the number of times a mat-shaped piezoelectric polymer manufactured by electrospinning is rolled around the surface of the inner electrode.

Subsequently, an outer electrode is formed on the surface of the piezoelectric polymer layer.

The outer electrode may be a carbon nanotube (CNT) sheet. The CNT sheet may be formed by drawing a carbon nanotube layer (hereinafter also referred to as a "CNT forest") that is vertically grown by chemical vapor deposition (CVD).

The CNT sheet is formed to be wrapped around the piezoelectric polymer layer. In detail, a CNT sheet is formed to be spirally wrapped around the piezoelectric polymer layer at a twist angle (θ) of 30 to 60 degrees in a clockwise or counterclockwise direction.

As used herein, the term "twist angle (θ)" refers to an alignment state of carbon nanotubes in the CNT sheet, specifying the angle of the carbon nanotubes with respect to the longitudinal axis of the piezoelectric fiber on the basis of the center of the piezoelectric fiber. This is shown in further detail with reference to FIG. 1.

Since the CNT sheet is strongly adhered to the piezoelectric polymer layer via Van der Waals force and has excellent deformability, the structure and properties of the CNT sheet may be stably maintained even under strain such as pushing, bending, or twisting of the piezoelectric fiber.

Finally, an insulating layer is formed on the outer electrode. Specifically, the outer electrode is coated with a polymer solution to form an insulating layer. No particular limitations are imposed on the polymer as long as it is an elastic material. Preferably, the polymer may be at least one polymer selected from the group consisting of a polyurethane (PU), a polyvinylalcohol (PVA), a silicone rubber, a polystyrene butadiene block copolymer (SBS), a polystyrene isoprene copolymer (SIS), a polystyrene ethylene butadiene block copolymer (SEBS), and a polystyrene ethylene propylene block copolymer (SEPS), more preferably, a polystyrene isoprene copolymer (SIS) and a polystyrene ethylene butadiene block copolymer (SEBS).

Although a method of coating the surface of the outer electrode with the solution is not particularly limited, a dip-coating method may preferably be used to form the insulating layer.

The solution may include the polymer at 1 to 20 wt %, and the remaining chloroform.

Hereinafter, the present invention will be described in further detail with reference to the following Examples which are set forth for the purpose of illustration, and are not to be construed as abridging or limiting the scope of the present invention. In addition, it is obvious that, based on the disclosure of the present invention including the following Examples, a person of ordinary skill in the art can readily perform a modification or revision of the present invention with regard to aspects for which concrete experimental data is not provided, and that such modifications and revisions also fall within the scope of the accompanying claims.

Example 1

1) Manufacture of Two-Dimensional PVDF-TrFE Mat:

1.5 g of PVDF-TrFE was mixed with 2.55 g of dimethylacetamide and 5.96 g of acetone to prepare a 15 wt % PVDF-TrFE solution (70:30, Piezotech, France). After being stirred for 24 hrs at room temperature, the resulting PVDF-TrFE solution was applied to an electrospinning device which was equipped with a high-voltage DC power supply (Wookyung Tech Co., Ltd., Korea) and composed of a syringe needle (15 kV) and an aluminum foil collector (~5 kV) spaced 20 cm from the needle. In consideration of the voltage between these components, a voltage of 20 kV was applied. While the PVDF-TrFE solution was fed at a speed of 4 μl/min with the aid of a syringe pump, a PVDF-TrFE mat was manufactured on the aluminum foil. The PVDF-TrFE mat was cut into rectangular pieces (1 cm×10 cm) before use.

2) Manufacture of One-Dimensional PVDF-TrFE Fiber:

Silver-coated nylon (PN #260151011717, 117/17 2ply, StatexShieldex, USA) was placed on an edge of the PVDF-TrFE mat in a two-dimensional form, after which a 5 wt % SEBS/chloroform solution was applied thereto. The PVDF-TrFE mat was then rolled around the silver-coated nylon to be formed into a one-dimensional fiber. This PVDF-TrFE fiber was immersed in a chloroform solution for about one day to remove SEBS.

Here, SEBS, that is, a polystyrene ethylene butadiene block copolymer, had a weight average molecular weight (Mw) of 1180000 g/mol or less.

3) Manufacture of Flexible Piezoelectric Fiber (Hereinafter Referred to as "FPF"):

One end of the SEBS-free PVDF-TrFE fiber manufactured in step 2) was attached to a rotation motor, and the other end was connected to a 2 g weight.

Subsequently, by spinning the SEBS-free PVDF-TrFE fiber, a CNT sheet obtained from a CNT forest manufactured by CVD was wrapped around the SEBS-free PVDF-TrFE from the bottom by rotation, resulting in the PVDF-TrFE fiber wrapped in the CNT sheet. Here, the twist angle (θ) of the CNT sheet was 30 degrees with respect to the lengthwise direction of the fiber.

Finally, a surface of the CNT-sheet-wrapped PVDF-TrFE fiber was coated with an 8 wt % SEBS/chloroform solution and dried at room temperature and thereby an FPF was obtained.

Example 2

A piezoelectric fiber in a twisted structure was manufactured using the piezoelectric fiber prepared in Example 1.

One end of the piezoelectric fiber prepared in Example 1 was connected to a rotation motor and the other end was fixed to a 26 g weight. The rotation motor was operated at a speed of 2,000 twists/m to manufacture the piezoelectric fiber in a coil structure. The coil-shaped piezoelectric fiber finally obtained had a diameter of 550 μm.

The piezoelectric fiber with a coiled structure obtained through the twisting process was shortened from an initial length of 4.3 cm to 1.2 cm. The piezoelectric fiber with a coiled structure was measured to respective resistances of 20 Ω/cm and 1.3 kΩ/cm for the inner electrode and the outer electrode.

Given an external load, the force per unit area (P, stress) of the piezoelectric fiber prepared in Example 1 can be calculated according to the following Equation 1:

$$P = \frac{1}{T} \int \frac{U^2(t)}{R} dt \qquad \text{[Equation 1]}$$

wherein,

U(t) is a real-time voltage, R is an external load resistance, and T is the time for which an external load is applied. In this case, an external load was 100 MΩ. The piezoelectric fiber prepared in Example 1 had a stress of 52 nW, and the length and diameter of the piezoelectric fiber were 1 cm and 330 μm, respectively.

Since the piezoelectric fiber prepared in Example 1 had a volume of about $3.4 \times 10^{-3}$ cm$^3$, the piezoelectric fiber prepared in Example 1 was determined to have a force per unit area (P, stress) of 1.53 μW/cm$^3$.

FIG. 3 shows X-ray diffraction spectra of PVDF-TrFE used to manufacture the PVDF-TrFE mat constituting the piezoelectric polymer layer of the piezoelectric fiber according to the present invention before (black) and after (red) electro spinning.

Generally, polyvinylidene-fluoride-based polymers exist in several crystalline structures: α-, β-, γ-, and δ-phases. Among them, the β-phase is most responsible for piezoelectricity because dipoles thereof are aligned in one direction.

As can be seen in FIG. 3, the PVDF-TrFE mat according to the present invention was transformed from the non-polar α-phase to the β-phase during electro spinning.

In other words, it can be seen that a high content of the β-phase was induced in the piezoelectric polymer layer of the present invention through electrospinning without an additional poling process, indicating that the piezoelectric polymer layer of the present invention exhibits excellent piezoelectricity.

Figure 4B:
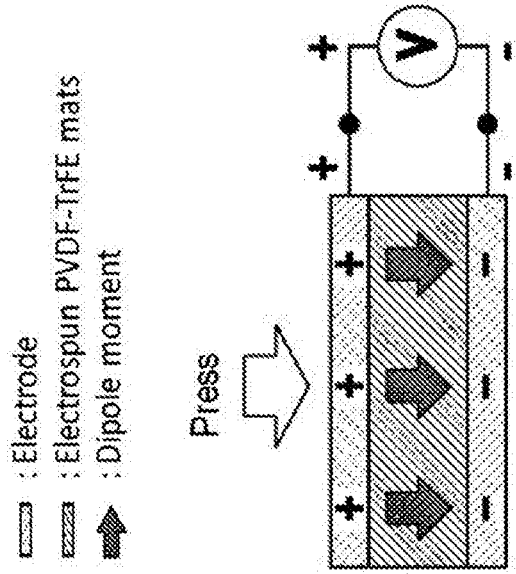
FIG. 4B is a diagram illustrating open circuit output voltages generated when pressures are applied to the PVDF-TrFE mat manufactured by electrospinning according to an embodiment of the present invention.

FIG. 4A is a conceptual diagram illustrating the structure of the PVDF-TrFE mat according to the present invention, manufactured by electrospinning, for use in a pressure test, and FIG. 4B is a diagram illustrating open circuit output voltages generated when pressures are applied to the PVDF-TrFE mat manufactured by electrospinning according to the present invention.

As shown in FIG. 4, the PVDF-TrFE mat according to the present invention exhibits piezoelectric performance in the thickness direction.

FIG. 5 is a conceptual diagram illustrating the procedure of Example 1-2) in which the PVDF-TrFE mat manufactured by electrospinning according to the present invention was rolled around the silver-coated nylon fiber serving as an inner electrode of the present invention, wherein red arrows represent dipole moments in the PVDF-TrFE mat.

As shown in FIG. 5, the PVDF-TrFE mat manufactured from the piezoelectric fibers by electrospinning according to the present invention was rolled around the silver-coated nylon fiber (inner electrode) in a cylindrical shape, resulting in formation of a piezoelectric polymer layer.

Naturally, the piezoelectricity of a piezoelectric material highly depends on the dipole array thereof. Piezoelectric materials such as bulk ceramics, monocrystalline ceramics and polymers have randomly oriented dipoles, and do not exhibit piezoelectricity. Therefore, in order for these piezoelectric materials to exhibit piezoelectricity, it is necessary to perform an additional poling process to align the dipoles in one direction.

However, since a high voltage has to be applied between a nozzle and an integrated electrode when nanofibers are manufactured by electrospinning, an electric dipole array is simultaneously generated during electrospinning. Accordingly, no additional poling process is needed after the piezoelectric nanofibers are obtained. The PVDF-TrFE mat in which a self-polarization array is made by electrospinning has dipole moments aligned in the thickness direction from the top surface to the bottom surface.

The mat is cylindrically rolled around the surface of the silver-coated nylon fiber to form the piezoelectric polymer layer, which undergoes directional conversion in which the dipole moments are radially aligned from the inside to the outer surface. In addition, such directional conversion is advantageously performed through a simple transformation between the two-dimensional piezoelectric mat and the one-dimensional piezoelectric fiber.

Furthermore, such procedures are effective for protecting the piezoelectric fiber from breakage that may occur in a poling process.

FIG. 6 is an optical image of the piezoelectric fiber manufactured in Example 1 of the present invention, showing that the piezoelectric fiber has a diameter of 320 μm and a length of 1 m or more.

FIG. 7 is an SEM image of the cross section of the piezoelectric fiber manufactured in Example 1 according to the present invention.

As shown in FIG. 7, in the piezoelectric fiber according to the present invention, a silver-coated nylon fiber (diameter: 180 μm, inner electrode); a piezoelectric polymer layer including a PVDF-TrFE mat; and an outer electrode including a CNT sheet are sequentially formed, and an insulating layer including SEBS is coated thereon.

Further, it was confirmed that the piezoelectric polymer layer composed of PVDF-TrFE has an average thickness of 30 μm.

FIG. 8 depicts output signals generated against movements of the piezoelectric fiber manufactured in Example 1 according to the present invention. In further detail, FIG. 8A is a graph of open circuit output currents generated when pressures are repeatedly applied to the piezoelectric fiber connected in a forward direction, and FIG. 8B is a graph of open circuit output currents generated when pressures are repeatedly applied to the piezoelectric fiber connected in a reverse direction. Here, a pressure of 160 kPa was repeatedly applied at an impact speed of 100 mm/s.

Figure 8A:
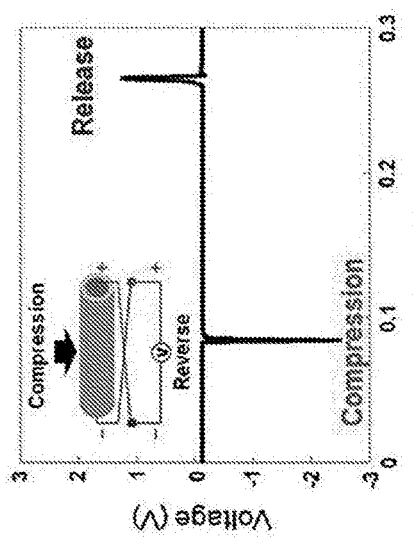
FIG. 8A is a graph of open circuit output currents generated when pressures are repeatedly applied to the piezoelectric fiber connected in a forward direction.
Figure 8B:
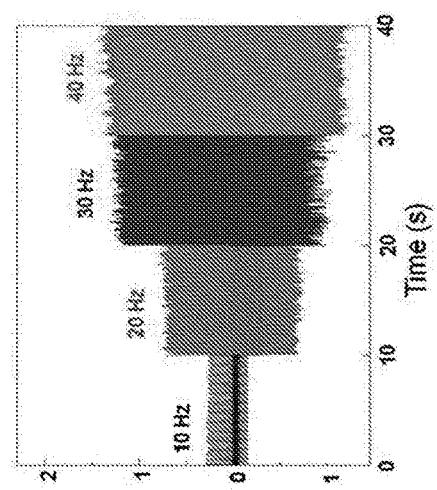
FIG. 8B is a graph of open circuit output currents generated when pressures are repeatedly applied to the piezoelectric fiber connected in a reverse direction. Here, a pressure of 160 kPa was repeatedly applied at an impact speed of 100 mm/s.
Figure 8C:
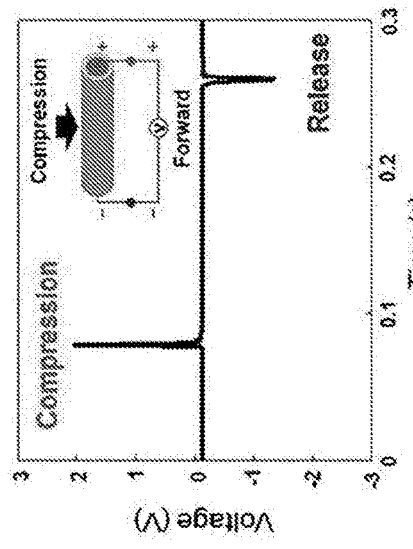
FIG. 8C is a graph of open circuit output currents of the piezoelectric fiber at a frequency of 40 Hz.
Figure 8D:
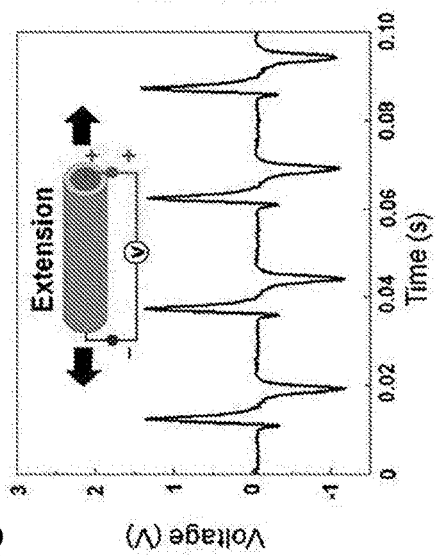
FIG. 8D is a graph of open circuit output currents of the piezoelectric fiber in a frequency range. The frequency range is from 10 Hz to 40 Hz.

In addition, FIG. 8C is a graph of open circuit output currents of the piezoelectric fiber at a frequency of 40 Hz. FIG. 8D is a graph of open circuit output currents of the piezoelectric fiber in a frequency range. The frequency range is from 10 Hz to 40 Hz.

As shown in FIG. 8, the piezoelectric fiber of the present invention has a maximum voltage of 2 V and a current of 15 nA when a pressure is applied thereto in the thickness direction.

In addition, it can be seen that, when the piezoelectric fiber of the present invention is connected in a reverse direction, a voltage is produced in an opposite direction, which indicates that the voltages detected in FIGS. 8A and 8B are produced from the piezoelectric fiber of the present invention itself.

In addition, when the piezoelectric fiber of the present invention was drawn in the lengthwise direction (FIGS. 8C and 8D), it was confirmed that the piezoelectric fiber was extended by about 5%, generating a maximum voltage of 1.4 V. Moreover, a greater drawing speed resulted in a higher output voltage.

FIG. 9A is a graph of short circuit output currents generated when the piezoelectric fiber manufactured in Example 1 according to the present invention was connected in a forward direction, and FIG. 9B is a graph of short circuit output currents generated when the piezoelectric fiber manufactured in Example 1 according to the present invention was connected in a reverse direction. Here, a pressure of 160 kPa was repeatedly applied at an impact speed of 100 mm/s.

As shown in FIG. 9, the piezoelectric fiber of the present invention has a maximum voltage of 2 V and a current of 15 nA, which is consistent with the data of FIGS. 8A and 8B.

Figure 10A:
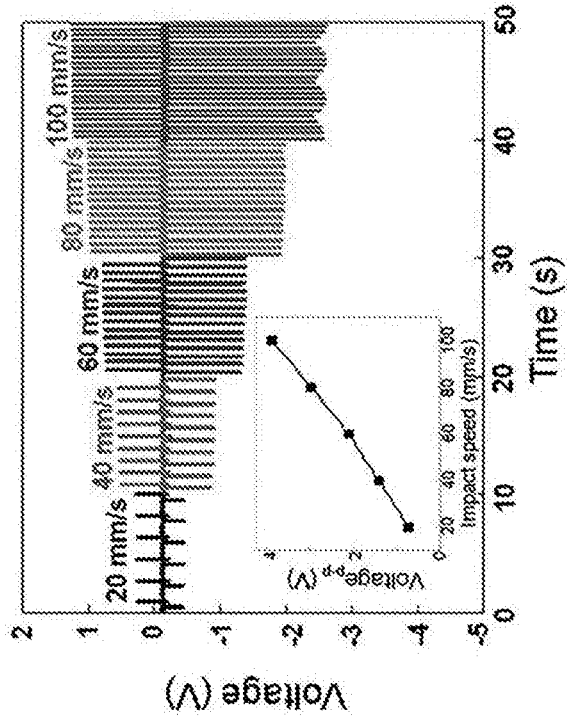
FIGS. 10A and 10B depicts a graph of open circuit output currents of the piezoelectric fiber manufactured in Example 1 as measured under various pressure conditions (30~160 kPa) (here, an impact speed was 100 mm/s).

FIG. 10A depicts a graph of open circuit output currents of the piezoelectric fiber manufactured in Example 1 as measured under various pressure conditions (30~160 kPa) (here, an impact speed was 100 mm/s).

Figure 10B:
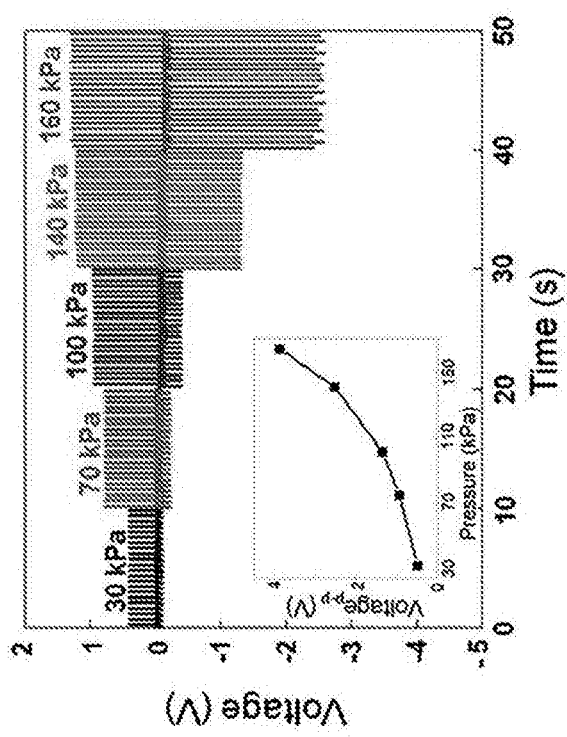

FIG. 10B depicts a graph of open circuit output currents of the piezoelectric fiber manufactured in Example 1 as measured under various impact speed conditions (20~100 mm/s) (here, a pressure was 160 kPa). Graphs inserted in FIGS. 10A and 10B are voltages plotted against pressures and impact speeds, respectively.

As shown in FIGS. 10A and 10B, the increase in pressure indicates an increase in strain, and thus it can be seen that the voltage was also increased from 0.5 V to 3.9 V, with the increase in pressure from 30 kPa to 160 kPa.

Also, it was confirmed that a linear increase of electric charge from 0.7 V to 3.9 V was induced by the increase in impact speed from 20 mm/s to 100 mm/s.

That is, it can be seen that a self-generated charge is also increased according to the external physical force applied to the piezoelectric fiber according to the present invention.

FIG. 11 shows a graph of the elastic strain (%) of the piezoelectric fiber manufactured in Example 1 against tensile stress. As understood from the data, the piezoelectric fiber manufactured in Example 1, which does not have a coil structure, was reversibly extended at an elastic strain of 0 to 7% under a tensile stress of 0 to 6 MPa, indicating that the piezoelectric fiber of the present invention has an elastic strain of 1 to 7%.

However, the piezoelectric fiber started to gradually increase in hysteresis at an elastic strain of 6%. Therefore, the piezoelectric fiber according to the present invention is imparted with a tensile stress of 0 to 5 MPa, which induces an elastic strain of 1 to 5%.

FIG. 12 is a graph of open circuit output voltages created by the piezoelectric fiber manufactured in Example 1 during repetitive cycles of contractions (maximum 10,050 cycles), illustrating the stability of the piezoelectric fiber of the present invention. Here, a pressure of 160 kPa was repeatedly applied at an impact speed of 100 mm/s.

As shown in FIG. 12, the piezoelectric fiber of the present invention was found to stably maintain output electric charge without change even after more than 10,000 cycles of contraction.

FIG. 13 illustrates the piezoelectricity of the coil-shaped piezoelectric fiber manufactured in Example 2 against lengthwise elongation. FIG. 13A is a graph in which resistance change ratios of the inner and outer electrodes are plotted when the piezoelectric fiber with a coil structure is deformed to 0 to 100%. In this figure, the insertion is an optical image of the piezoelectric fiber with a coil structure manufactured in Example 2.

Figure 13B:
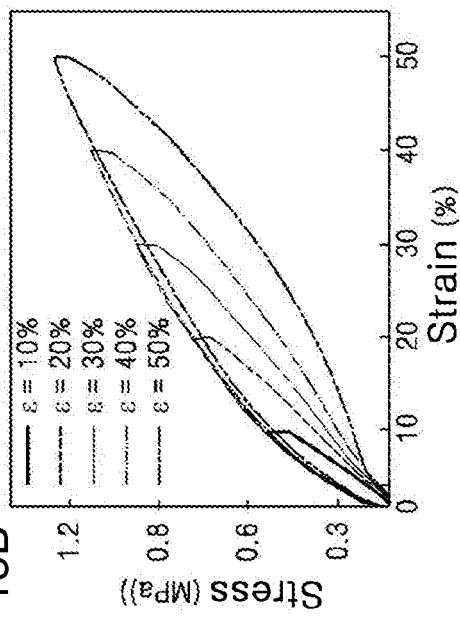
FIG. 13B depicts a graph of the elastic strain of the piezoelectric fiber with a coil structure manufactured in Example 2 against external force (tensile strength).
Figure 13D:
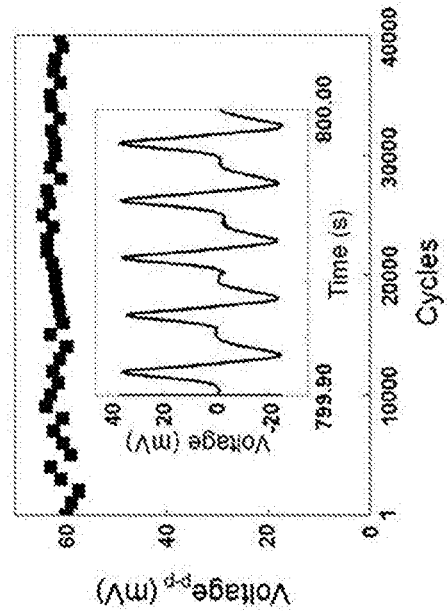
FIG. 13D is a graph of output voltages created by the coil-shaped piezoelectric fiber manufactured in Example 2, during 40,000 cycles of elongation at an elastic strain of 50% and a frequency of 50 Hz.
Figure 13A:
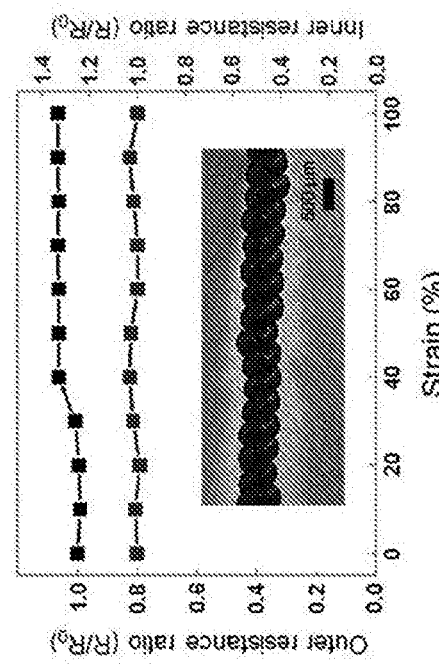
FIG. 13A is a graph in which resistance change ratios of the inner and outer electrodes are plotted when the piezoelectric fiber with a coil structure is deformed to 0 to 100%. In this figure, the insertion is an optical image of the piezoelectric fiber with a coil structure manufactured in Example 2.

As shown in FIG. 13A, the coil-shaped piezoelectric fiber manufactured in Example 2 of the present invention can be extended (elongated) at an elongation deformation of 0 to 100%. During such elongation, respective resistance change ratios of the outer and inner electrodes remained consistent, except for increments of 0.07 or less. Taken together, the data implies that the coil-shaped piezoelectric fiber manufactured in Example 2 is a highly flexible and elastic electrode having a stable elastic strain of 50% or more.

In other words, when an external tensile strength is applied in a lengthwise direction to elongate the coil-shaped piezoelectric fiber, it is elongated through a structural modification in which distances between coils increase and the diameter decreases. Hence, the range of extendable length, that is, the elastic strain of the coil-shaped piezoelectric fiber, is more than that of the piezoelectric fiber manufactured in Example 1.

FIG. 13B depicts a graph of the elastic strain of the piezoelectric fiber with a coil structure manufactured in Example 2 against external force (tensile strength).

As shown in FIG. 13B, the coil-shaped piezoelectric fiber exhibited an elastic strain of 50%. In other words, the coil-shaped piezoelectric fiber of Example 2 has a high elastic strain even under a low tensile strength (50% at 1.2 MPa). In contrast, the piezoelectric fiber of Example 1 has a low elastic strain under a high tensile strength (5% at 5 MPa).

It can be seen that the coil-shaped piezoelectric fiber of the present invention, although increasing in hysteresis with an increase in elastic strain, exhibits steady reversible elasticity even when it is extended at an elastic strain of 10 to 50%.

Figure 13C:
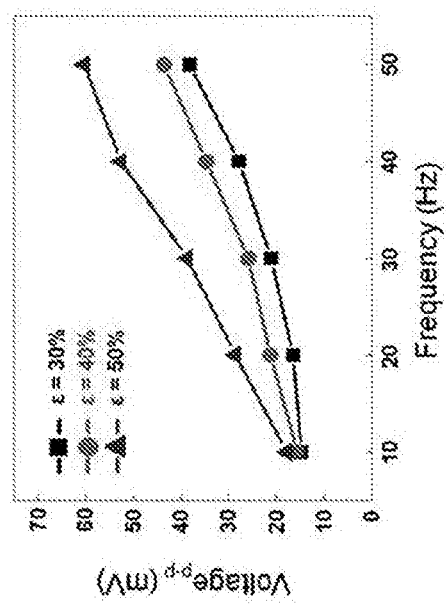
FIG. 13C is a graph in which open circuit output voltages of the coil-shaped piezoelectric fiber manufactured in Example 2 are plotted against frequency (10 to 50 Hz) when it is elongated at an elastic strain of 30%, 40%, and 50%.

FIG. 13C is a graph in which open circuit output voltages of the coil-shaped piezoelectric fiber manufactured in Example 2 are plotted against frequency (10 to 50 Hz) when it is elongated at an elastic strain of 30%, 40%, and 50%.

As shown in FIG. 13C, the output voltage of the coil-shaped piezoelectric fiber of the present invention increased with an increase in frequency and with elastic strain. Also, its piezoelectricity was found to remain consistent even when the elastic strain was increased.

In detail, the coil-shaped piezoelectric fiber manufactured in Example 2 exhibits reversible elasticity and excellent piezoelectricity even at an elastic strain of 50% or more, showing a remarkable improvement in comparison with a conventional piezoelectric thread (0.18%) or elastic piezoelectric device (30%).

FIG. 13D is a graph of output voltages created by the coil-shaped piezoelectric fiber manufactured in Example 2, during 40,000 cycles of elongation at an elastic strain of 50% and a frequency of 50 Hz.

As shown in FIG. 13D, it was confirmed that the coil-shaped piezoelectric fiber manufactured in Example 2 was discovered to consistently maintain output voltages without degradation during 40,000 cycles of elongation. Therefore, it can be seen that the coil-shaped piezoelectric fiber according to the present invention has excellent durability.

Figure 14A:
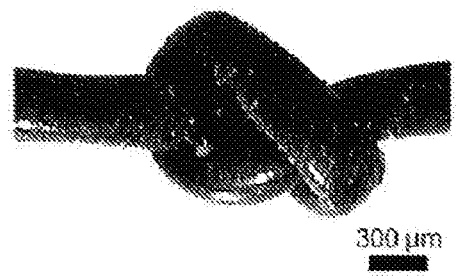
FIG. 14A is an optical image of the piezoelectric fiber manufactured in Example 1 when it is knotted.
Figure 14B:
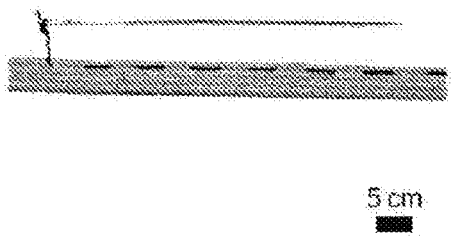
FIG. 14B is an optical image of the piezoelectric fiber manufactured in Example 1 when a rubber band piece is sewed with the fiber.
Figure 14C:
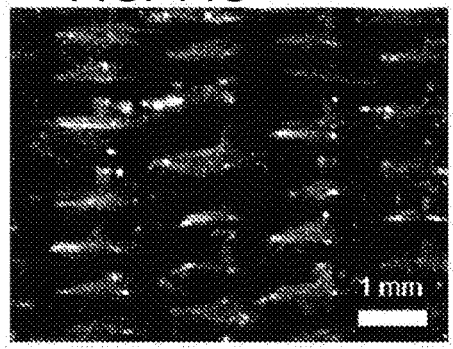
FIG. 14C is an optical image of a fabric in which the piezoelectric fiber manufactured in Example 1 is woven.
Figure 14D:
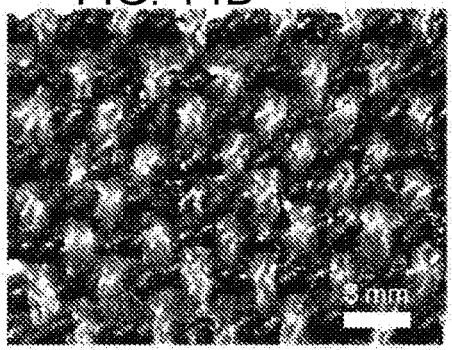
FIG. 14D is an optical image of an elastic fabric in which the piezoelectric fiber manufactured in Example 2 is woven with a polyethylene fiber.

FIG. 14A is an optical image of the piezoelectric fiber manufactured in Example 1 when it is knotted. FIG. 14B is an optical image of the piezoelectric fiber manufactured in Example 1 when a rubber band piece is sewed with the fiber. FIG. 14C is an optical image of a fabric in which the piezoelectric fiber manufactured in Example 1 is woven. FIG. 14D is an optical image of an elastic fabric in which the piezoelectric fiber manufactured in Example 2 is woven with a polyethylene fiber.

As shown in FIG. 14, both the piezoelectric fiber and the coil-shaped piezoelectric fiber in accordance with the present invention are flexible and elastic enough to be knotted, sewed, or woven like threads.

When the knot of FIG. 14A came undone, the piezoelectric fiber manufactured in Example 1 returned to its original state. Also, no damaged parts were observed in the CNT sheet serving as the outer electrode of the piezoelectric fiber.

Further, even when the piezoelectric fiber manufactured in Example 1 was used in sewing on a rubber band having a thickness of 3 mm, no damage was observed. It can be seen that the piezoelectric fiber of the present invention can be used in sewing in various patterns on the surface of flexible materials, and thus can be used in various piezoelectric devices (FIG. 14B).

FIG. 14C shows a fabric woven with 20 of the piezoelectric fibers manufactured in Example 1. The woven fabric of FIG. 14C has similar properties to general woven fabrics and can be easily transformed into variously designed clothing. In addition, the fabric has excellent flexibility and does not have restrictions on various motions of the human body, including bending and twisting.

In FIG. 14D, a fabric prepared by mixing the coil-shaped piezoelectric fiber manufactured in Example 2 with a different fiber (polyethylene fiber) is shown. This piezoelectric fabric was shown to exhibit flexibility similar to that of general fabrics shown in FIG. 14C. These results demonstrate the high applicability of the piezoelectric fiber and coil-shaped piezoelectric fiber of the present invention.

INDUSTRIAL APPLICABILITY

Since the piezoelectric fiber of the present invention has excellent flexibility and elasticity, it can be applied in power supplies for a variety of sizes and types of wearable electronic devices and portable devices, clothing, etc. In addition, due to excellent piezoelectricity and durability, the piezoelectric fiber of the present invention can effectively convert deformation or vibration applied by external physical force into electric energy, and thus may replace existing ceramic-based and polymer piezoelectric bodies, etc.

The invention claimed is:

1. A piezoelectric fiber comprising:
   an inner electrode composed of at least one conductive fiber member;
   a piezoelectric polymer layer formed in at least one layer to be rolled around a surface of the inner electrode;
   an outer electrode formed to wrap a surface of the piezoelectric polymer layer; and
   an insulating layer formed on the surface of the outer electrode,
   wherein the outer electrode is a carbon nanotube (CNT) sheet, said CNT sheet having a plurality of carbon nanottubes arranged substantially parallel to each other, and said carbon nanotubes in CNT sheet spirally wrapping around the piezoelectric polymer layer.

2. The piezoelectric fiber according to claim 1, wherein the conductive fiber member includes at least one selected from the group consisting of a conductive metal-coated polymer fiber, a carbon fiber and a conductive metal-coated carbon fiber, and the conductive metal includes at least one selected from the group consisting of Fe, Ni, Cr, Ti, Mo, Ag, Au, Al, and Cu.

3. The piezoelectric fiber according to claim 1, wherein the piezoelectric polymer layer includes at least one piezoelectric polymer selected from the group consisting of PVDF, PVDF-TrFE, PVDF-TrFE-CFE and PVDF-HFP.

4. The piezoelectric fiber according to claim 1, wherein the piezoelectric polymer layer has a network structure in which nanofibers are randomly distributed in a form of a mat.

5. The piezoelectric fiber according to claim 1, wherein the piezoelectric polymer layer has a multilayer structure according to the number of wrapping times around the inner electrode.

6. The piezoelectric fiber according to claim 1, wherein the piezoelectric polymer layer has dipole moments, and the dipole moments are arranged in radial direction with respect to the center of the piezoelectric fiber.

7. The piezoelectric fiber according to claim 1, wherein the carbon nanotubes are aligned at a twist angle ($\theta$) of 30 to 60 degrees with respect to a longitudinal axis of the piezoelectric fiber.

8. The piezoelectric fiber according to claim 1, wherein the insulating layer includes at least one polymer selected from the group consisting of polyurethane (PU), polyvinylalcohol (PVA), silicon rubber, a polystyrene butadiene copolymer (SBS), a polystyrene isoprene copolymer (SIS), a polystyrene ethylene butadiene block copolymer (SEBS), and a polystyrene ethylene propylene block copolymer (SEPS).

9. The piezoelectric fiber according to claim 1, wherein the piezoelectric fiber has a diameter of 200 to 500 μm.

10. The piezoelectric fiber according to claim 1, wherein the piezoelectric fiber has an elastic strain of 1 to 10%.

11. A coil-shaped piezoelectric fiber manufactured by twisting the piezoelectric fiber according to claim 1.

12. The coil-shaped piezoelectric fiber according to claim 11, wherein the coil-shaped piezoelectric fiber is prepared by twisting the piezoelectric fiber at a density of 1,000 to 10,000 twists/m.

13. The coil-shaped piezoelectric fiber according to claim 11, wherein the coil-shaped piezoelectric fiber has an elastic strain of 10 to 100%.

14. A method of manufacturing a piezoelectric fiber comprising:
   I) preparing an inner electrode including a conductive fiber member;
   II) forming a piezoelectric polymer layer by rolling a mat-type piezoelectric polymer manufactured by electrospinning, around a surface of the inner electrode;
   III) forming an outer electrode on a surface of the piezoelectric polymer layer; and
   IV) forming an insulating layer on the outer electrode,
   wherein the outer electrode is a CNT sheet, said CNT sheet having a plurality of carbon nanotubes arranged substantially parallel to each other, and said carbon nanotubes in the CNT sheet spirally wrapping around the piezoelectric polymer layer.

15. The method according to claim 14, wherein, in step II), the piezoelectric polymer layer is formed in a single layer or multilayer structure according to the number of times the mat-formed piezoelectric polymer is rolled around the surface of the inner electrode.

16. The method according to claim 14, wherein, in step II), the mat-type piezoelectric polymer is any one piezoelectric polymer selected from the group consisting of PVDF, PVDF-TrFE, PVDF-TrFE-CFE and PVDF-HFP.

17. The method according to claim 14, wherein, in step III), the outer electrode is a CNT sheet, and the CNT sheet is formed by drawing a CNT forest vertically grown by chemical vapor deposition (CVD).

18. The method according to claim 14, wherein, in step IV), the forming of the insulating layer on the outer electrode is carried out by forming an insulating layer by coating the surface of the outer electrode with a solution containing at least one polymer selected from the group consisting of polyurethane (PU), polyvinylalcohol (PVA), silicon rubber, a polystyrene butadiene copolymer (SBS), a polystyrene isoprene copolymer (SIS), a polystyrene ethylene butadiene block copolymer (SEBS) and a polystyrene ethylene propylene block copolymer (SEPS).

* * * * *